United States Patent
Orio

(10) Patent No.: US 7,584,409 B2
(45) Date of Patent: Sep. 1, 2009

(54) METHOD AND DEVICE FOR ALTERNATELY DECODING DATA IN FORWARD AND REVERSE DIRECTIONS

(75) Inventor: Masao Orio, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 238 days.

(21) Appl. No.: 11/485,310

(22) Filed: Jul. 13, 2006

(65) Prior Publication Data

US 2006/0253769 A1 Nov. 9, 2006

Related U.S. Application Data

(63) Continuation of application No. 11/248,182, filed on Oct. 13, 2005.

(30) Foreign Application Priority Data

Oct. 14, 2004 (JP) ............................ 2004-299670

(51) Int. Cl.
*H03M 13/03* (2006.01)
(52) U.S. Cl. ...................................... 714/796
(58) Field of Classification Search ................. 714/755, 714/795, 796
See application file for complete search history.

(56) References Cited

U.S. PATENT DOCUMENTS

| 6,182,261 | B1 | 1/2001 | Haller et al. |
| 6,879,267 | B2 * | 4/2005 | Yamazaki ..................... 341/64 |
| 6,961,921 | B2 * | 11/2005 | Hepler et al. ............... 714/796 |
| 6,999,531 | B2 * | 2/2006 | Jin .............................. 375/341 |
| 7,181,670 | B2 * | 2/2007 | Hepler et al. ............... 714/755 |
| 7,228,483 | B2 * | 6/2007 | Kuwahara .................... 714/755 |
| 2003/0028838 | A1 | 2/2003 | Chang et al. |
| 2003/0033571 | A1 * | 2/2003 | Bohnke ....................... 714/758 |

FOREIGN PATENT DOCUMENTS

| EP | 1 024 601 A1 | 8/2000 |
| EP | 1122890 A2 | 8/2001 |
| JP | 2004-80508 A | 3/2004 |
| KR | 2003-0005321 A | 1/2003 |

OTHER PUBLICATIONS

Wang, et al.:"Area-Efficient High-Speed Decoding Schemes for Turbo Decoders"; IEEE Transactions on Very Large Scale Integration Systems;IEEE Service Center, Piscataway, NJ,US; vol. 10, No. 6; Dec. 2002 ;pp. 902-912.

(Continued)

*Primary Examiner*—Guy J Lamarre
*Assistant Examiner*—Sam Rizk
(74) *Attorney, Agent, or Firm*—Sughrue Mion, PLLC

(57) ABSTRACT

A decoding device according to the one embodiment of the invention includes: a first decoder performing a first decoding based on first encoded data obtained by encoding unencoded data, and second soft-output data to generate first soft-output data; a second decoder performing a second decoding based on second encoded data obtained by interleaving the unencoded data and encoding the interleaved data, and the first soft-output data to generate the second soft-output data; and a hard decision part outputting decoded data through hard decision on the first soft-output data.

4 Claims, 9 Drawing Sheets

OTHER PUBLICATIONS

Andrew J. Viterbi: "An Intuitive Justification and a Simplified Implementation of the Map Decoder for Convolutional Codes"; IEEE Journal on Selected Areas in Communications; IEEE Service Center, Piscataway, NJ, US; vol. 16, No. 2; Feb. 1998; pp. 260-264.

Steven S. Pietrobon, "Implementation and Performance of a Turbo/Map Decoder", International Journal of Satellite Communication, 1998, pp. 23-46, vol. 16, Australia.

* cited by examiner

METHOD AND DEVICE FOR ALTERNATELY DECODING DATA IN FORWARD AND REVERSE DIRECTIONS

This is a continuation of application Ser. No. 11/248,182 filed Oct. 13, 2005, which claims priority from Japanese Patent Application No. 2004-299670, Oct. 14, 2004, the entire disclosures of which are hereby incorporated by reference.

BACKGROUND OF THE INVENTION

1. Field of the Invention

The present invention relates to a decoding method and device. In particular, the invention relates to a decoding method and device, which repeatedly decode first encoded data and second encoded data.

2. Description of Related Art

Digital communication systems have employed an error correction code for correcting code error occurring in a transmission channel. Particularly in a mobile communication system, a code error easily occurs since the intensity of the electric wave largely fluctuates due to phasing. Thus, a high correction ability is required of the error correction code. A turbo code has attracted an attention as an error correction code having an error correction ability close to the Shannon limit, and has been used in, for example, a W-CDMA (wideband code division multiple access) or CDMA-2000 as a three-generation mobile communication system.

FIG. 8 is a block diagram showing the configuration of a typical encoding device for generating a turbo code. An encoding device 80 is provided on a transmission side of a communication system, for example, and encodes an information sequence U as unencoded data into PCCCs (parallel concatenated convolutional codes) of the turbo code to output the resultant to the outside, such as a transmission channel.

As shown in FIG. 8, the encoding device 80 includes a first encoder 81 and a second encoder 82 as systematic convolutional encoders, and an interleaver 83 for interleaving (rearranging) data.

The first encoder 81 encodes the input information sequence (systematic portion) U to generate redundant bits P and outputs the redundant bits P to the outside. The interleaver 83 rearranges the bits of the received systematic portion U into a predetermined interleave pattern to create a systematic portion U'. The systematic portion U' is sent to the second encoder 82. The second encoder 82 encodes the systematic portion U' to generate redundant bits P' and outputs the redundant bits P' to the outside.

Thus, the encoding device 80 outputs the systematic portion U, the redundant bits P, the systematic portion U' and the redundant bits P'. A pair (U, P) of the systematic portion U and the redundant bit P is called a first element code (encoded data), while a pair (U', P') of the systematic portion U' and the redundant bit P' is called a second element code E'. In this specification, data not apostrophized refers to the first element code or uninterleaved data; apostrophized data refers to the second element code or interleaved data.

Decoding the thus-encoded turbo code refers to turbo decoding. The turbo decoding performs decode iterations while exchanging extrinsic information between a decoder decoding the first element code E and a decoder decoding the second element code E'. For example, one disclosed in Japanese Unexamined Patent Publication No. 2004-80508 has been known as a conventional decoder used for turbo decoding.

FIG. 9 is a block diagram showing the configuration of a conventional decoding device for turbo decoding. A conventional decoding device 90 decodes the first element code E and the second element code E' supplied from the encoding device 80 of FIG. 8. The conventional decoding device 90 includes, as shown in FIG. 9, a first decoder 91 for decoding the first element code E, a second decoder 92 for decoding the second element code E', an interleaver 93 for interleaving data, deinterleavers 94 and 95 for deinterleaving data (rearranging the interleave pattern into the original pattern), and a hard decision part 96 for performing hard decision on soft-output data.

The first decoder 91 and the second decoder 92 decode dada based on a soft-input/soft-output decoding method. As the soft-input/soft-output decoding method, there have been known SOVA (soft-output Viterbi algorithm) and MAP (maximum a posteriori). For example, the first decoder 91 and the second decoder 92 decode data based on Max-Log-MAP algorithm as an example of the MAP.

According to the Max-Log-MAP algorithm, Viterbi decoding is carried out based on a state transition diagram called a Trellis diagram. A path connecting between the states at respective time points corresponds to a code sequence to be decoded. The likelihood (path metric) is calculated for all possible paths, and a path of the highest likelihood is set as a survival path and data sequence on the path is used as decoded data.

FIG. 10 shows an example of a Trellis diagram used in the Max-Log-Map algorithm. According to the Max-Log-MAP algorithm, in decoding data at a point A, the path metric from a second position ahead of the point A (starting point in the figure) and the path metric from a first position (end point in the figure) behind the point A are calculated. A processing for carrying out the Viterbi decoding in the direction from the starting point to the end point on the Trellis diagram (downward direction) to calculate path metric is referred to as "forward processing". The path metric calculated through the forward processing is referred to as α path metric. In contrast, a processing for carrying out the Viterbi decoding in a direction opposite to that of the forward processing (direction from the end point to the starting point: upward direction) to calculate path metric is referred to as "backward processing". The path metric calculated through the backward processing is referred to as β path metric.

Further, according to the Max-Log-MAP algorithm, after the forward processing or backward processing, the likelihood (branch metric) of a branch connecting a path metric and the β path metric is calculated to derive the log likelihood ratio (LLR) and extrinsic information from the α path metric, the β path metric and the branch metric. The log likelihood ratio or extrinsic information is soft-output data (reliability) as the soft-input/soft-output decoding result. The computational expression thereof is disclosed in Japanese Unexamined Patent Publication No. 2004-80508.

FIG. 11 is a schematic diagram showing a conventional decoding method based on turbo decoding. The conventional decoding method is implemented by use of the conventional decoding device of FIG. 9. According to the conventional decoding method, the first element code E is decoded (1101) before the second element code E' is decoded (1102). For example, the first decoder 91 decodes data using the received first element code E, and extrinsic information LE2 deinterleaved by the deinterleaver 94 to send extrinsic information LE1 to the interleaver 93. Next, the second decoder 92 decodes data using the received second element code E' and extrinsic information LE1' interleaved by the interleaver 93 to output extrinsic information LE2' to the deinterleaver 94.

Further, in decoding the first element code E, the forward processing is carried out (1103) before the backward processing is carried out (1104). Likewise, in decoding the second element code E', the forward processing is carried out (1105) before the backward processing is carried out (1106). Then, the decoding processings for the first element code E and for the second element code E' are defined as one cycle, and this decoding cycle is repeated N times (1107).

After the decoding cycle for the first element code E and the second element code E' is iterated N times, deinterleaving processing is performed (1108), followed by hard decision to output a decoded sequence D (1109). For example, the deinterleaver 95 deinterleaves the log likelihood ratio L' calculated by the second decoder 92, and the hard decision part 96 performs hard decision on the deinterleaved log likelihood ratio L to output the decoded sequence D.

It has now been discovered that, with the conventional decoding device 90, after the decoding is repeated N times, the second decoder 92 outputs the interleaved log likelihood ratio L', so it is necessary to deinterleave the ratio to perform the hard decision thereon. Also, with the second decoder 92, the backward processing follows the forward processing, so the log likelihood ratio L' is output from the end to the top of the data. Hence, the ratio needs to be rearranged in the reverse order (from the top to end).

Meanwhile, as for the turbo decoding, there is known a method of controlling the number of decoding iterations for the first element code E and the second element code E' (repeat control). FIG. 12 is a block diagram showing the configuration of the conventional decoding device that performs the repeat control. As shown in FIG. 12, a conventional decoding device 120 includes, in addition to the components of the conventional decoding device 90 of FIG. 9, a CRC (cyclic redundancy check) part 97 for the repeat control.

FIG. 13 is a schematic diagram showing the conventional decoding method for the repeat control. The conventional decoding method is implemented by use of the conventional decoding device 120 of FIG. 12. The conventional decoding method involves CRC processing besides the steps of the decoding method of FIG. 11.

As shown in FIG. 13, the CRC check is made at the same timing as the forward processing (1103) during the decoding processing for the first element code E (1110). For example, the hard decision part 96 performs the hard decision on the extrinsic information LE2 deinterleaved by the deinterleaver 94, and the CRC part 97 performs the CRC about the decoded sequence D which is the hard decision result. As a result of the CRC, if an error is found, the decoding is repeated. After the decoding is repeated N times, as in FIG. 11, the log likelihood ratio L' is deinterleaved, followed by hard decision on the log likelihood ratio L, and then the CRC check is performed again (1111).

If no error is detected as a result of the CRC checking in a decoding iteration, the decoding is no longer repeated. Then, the extrinsic information LE2 subjected to the CRC is deinterleaved, and then the hard decision is performed thereon to output the decoded sequence D.

It has now been discovered that, according to the conventional decoding device 120, the CRC check is made on the result of hard decision about the extrinsic information LE2 deinterleaved by the deinterleaver 94. In general, the extrinsic information is not data created for hard decision to produce a decoded sequence. Hence, there is a problem that the repeat control accuracy is low. On the other hand, in order to use the log likelihood ratio L instead of the extrinsic information LE2, a memory temporarily storing the log likelihood ratio L is necessary, which requires a larger memory capacity.

Further, the extrinsic information LE2 used for the CRC is the second element code E' decoded in the previous decoding iteration (cycle). In order to perform the CRC about the extrinsic information LE2, the extrinsic information LE2 should be deinterleaved, so the processing time for this deinterleaving (half the time period necessary for one decoding cycle (decoding iteration)) is wasted.

As mentioned above, according to the conventional decoding device 90, after the decoding is repeated N times, it is necessary to deinterleave the interleaved log likelihood ratio L' or rearrange the data in the reverse order for hard decision. Therefore, the deinterleaving processing or rearrangement takes much time, prolonging the decoding processing.

SUMMARY OF THE INVENTION

A decoding device according to the present invention includes: a first decoder performing a first decoding based on first encoded data obtained by encoding unencoded data, and second soft-output data to generate first soft-output data; a second decoder performing a second decoding based on second encoded data obtained by interleaving and encoding the unencoded data and the first soft-output data to generate the second soft-output data; and a hard decision part outputting decoded data through hard decision on the first soft-output data. Accordingly, it is possible to omit the deinterleaving or rearrangement processing, and shorten the time necessary for the decoding processing.

A decoding device according to the present invention includes: a first decoder performing decoding based on first encoded data obtained by encoding unencoded data to generate first soft-output data; a second decoder performing decoding based on second encoded data obtained by interleaving and encoding the unencoded data to generate second soft-output data; and a hard decision part outputting decoded data through hard decision on the first soft-output data. Hence, it is possible to omit the deinterleaving or rearrangement processing, and shorten the time necessary for the decoding processing.

A decoding method according to the present invention includes: performing a first decoding based on first encoded data obtained by encoding unencoded data, and second soft-output data to generate first soft-output data; performing a second decoding based on second encoded data obtained by interleaving and encoding the unencoded data and the first soft-output data to generate the second soft-output data; and outputting decoded data through hard decision on the first soft-output data. Hence, it is possible to omit the deinterleaving or rearrangement processing, and shorten the time necessary for the decoding processing.

According to the present invention, it is possible to provide a decoding method and device capable of shortening the time necessary for decoding processing.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment of the Invention

Figure 1:
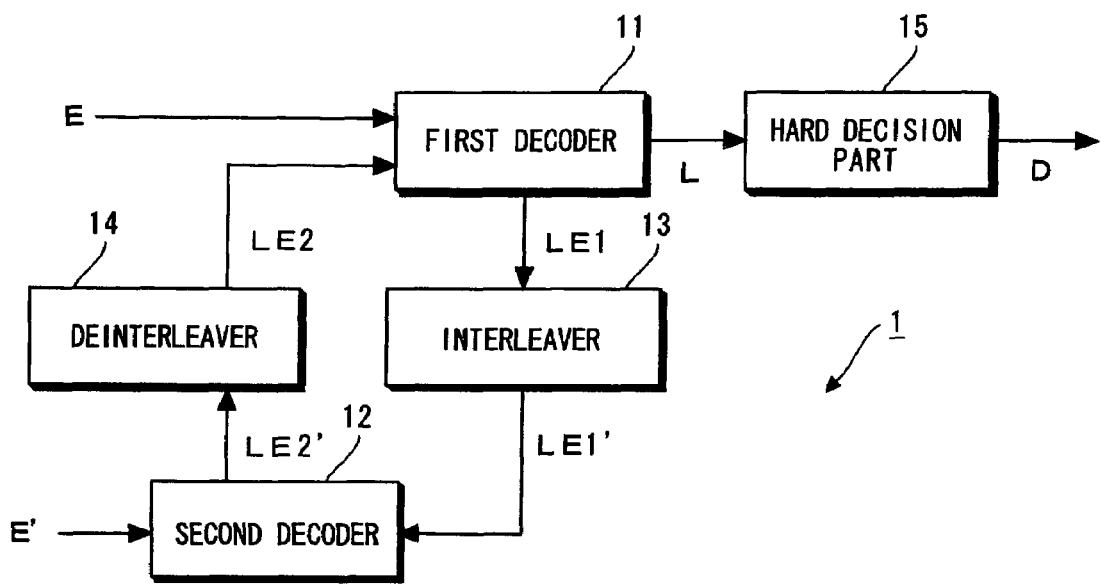
FIG. 1 is a block diagram showing the configuration of a decoding device according to the present invention.
Figure 2A:
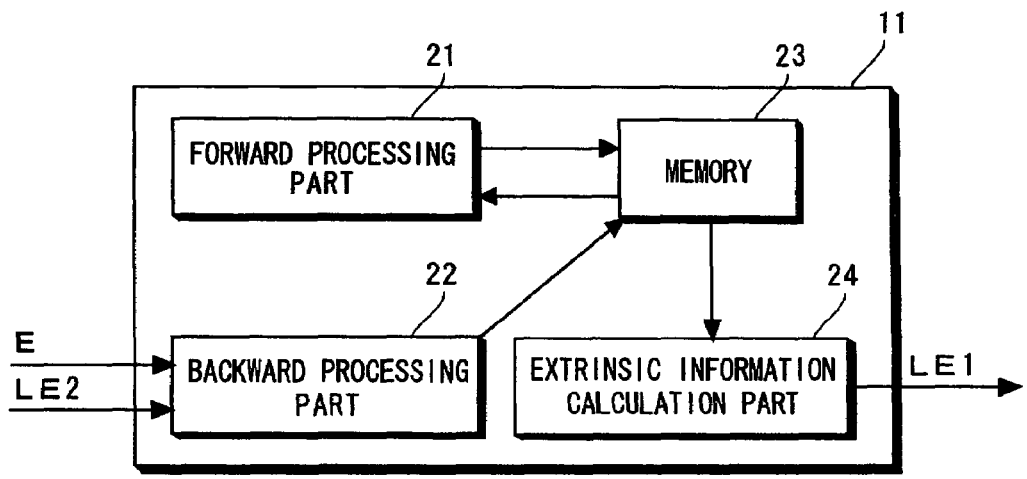
FIGS. 2A and 2B are block diagrams each showing the configuration of a decoding device according to the present invention.
Figure 2B:
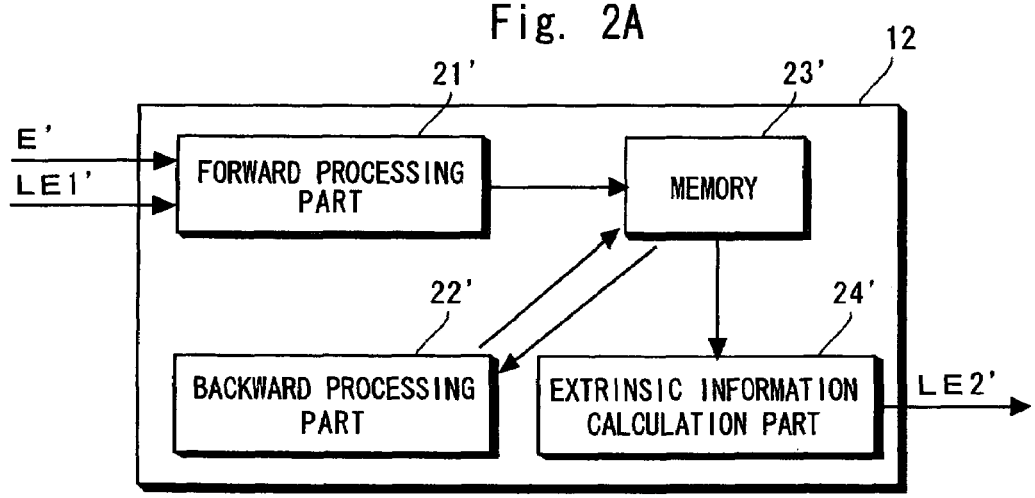
Figure 3:
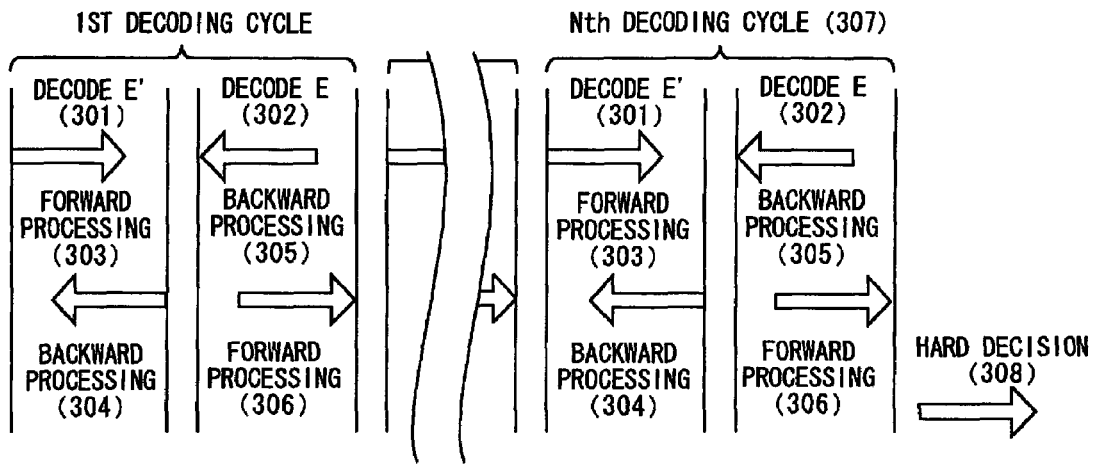
FIG. 3 illustrates a decoding method according to the present invention.

Referring first to FIGS. 1 to 3, a decoding method and device according to a first embodiment of the present invention are described. A feature of the decoding method and device according to this embodiment is that a second element code E' and a first element code E are repeatedly decoded in this order, and the decoding iteration ends at the completion of the forward processing in the decoding processing for the first element code E.

Figure 8:
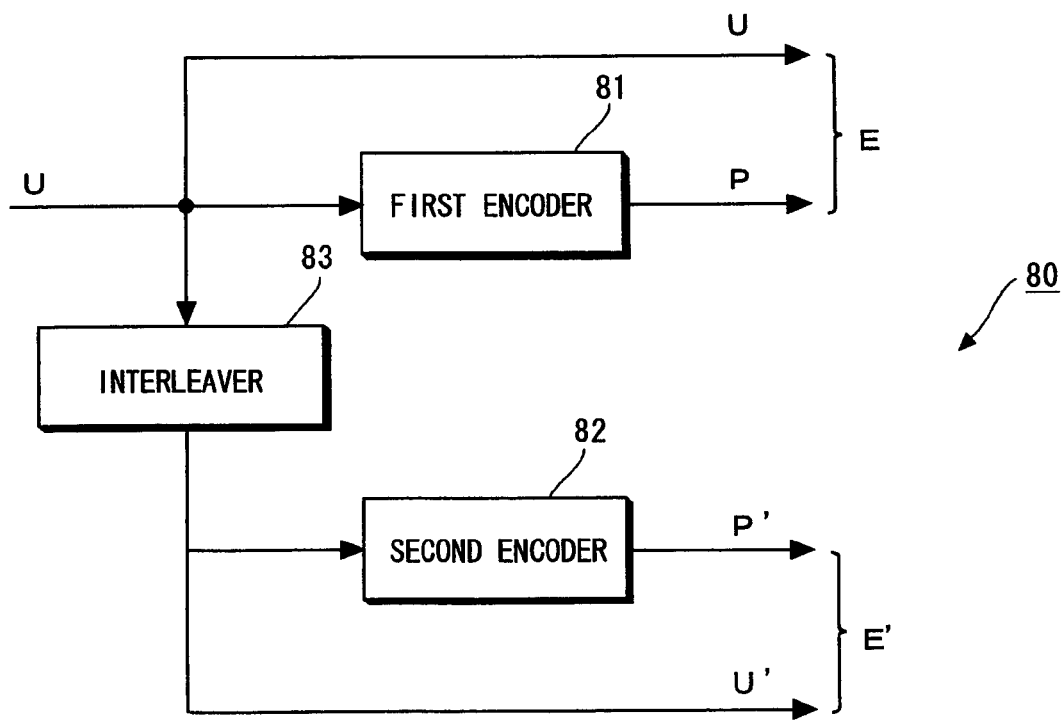
FIG. 8 is a block diagram showing the configuration of a typical decoding device.

Referring now to FIG. 1, the configuration of the decoding device according to this embodiment is described. A decoding device 1 is used for turbo decoding, and for example, decodes the first element code E and second element code E' from an encoding device 80 of FIG. 8. That is, the decoding device 1 receives the first element code E (first encoded data) obtained by encoding an information sequence U (unencoded data), and the second element code E' obtained by interleaving the information sequence U to be encoded (second encoded data). The first element code E and the second element code E' are input to the decoding device 1 through a transmission channel, and noise is superimposed thereon on the transmission channel, so a code error occurs. The decoding device 1 turbo-decodes the first element code E and the second element code E', and corrects the code error with its high correction ability.

As shown in FIG. 1, the decoding device 1 includes a first decoder 11, a second decoder 12, an interleaver 13, a deinterleaver 14, and a hard decision part 15.

The first decoder 11 corresponds to a first encoder 81 of the encoding device 80, and decodes the first element code E. The first decoder 11 is a soft-input/soft-output decoder that is capable of decoding based on SOVA and MAP. The first decoder 11 decodes data based on, for example, Max-Log-MAP algorithm. Through the decoding, the soft-output data is created. The soft-output data is data representative of reliability, that is, the probability of being "0" or "1" (likelihood). For example, if the soft-output data is a large positive value, the probability of being "0" is high. In contrast, if the soft-output data is a large negative value, the probability of being "1" is high. Based on the Max-Log-MAP algorithm, the extrinsic information or log likelihood ratio is generated as the soft-output data. The extrinsic information is data exchanged between the first decoder 11 and the second decoder 12 in the decoding iterations. The log likelihood ratio is data that is subjected to hard decision to produce a decoded sequence.

The first decoder 11 performs decoding using the received first element code E and the extrinsic information LE2 deinterleaved by the deinterleaver 14 to output the extrinsic information LE1 derived through the decoding. In addition, the first decoder 11 repeats decoding together with the second decoder 12 a predetermined number of times, and then outputs the log likelihood ratio L derived through the decoding to the hard decision part 15. In a decoding cycle (decoding iteration) the second decoder 12 executes decoding before the first decoder 11 executes decoding and the cycle is repeated N times.

The second decoder 12 corresponds to a second encoder 82 of the encoding device 80, and decodes the second element code E'. The second decoder 12 is a soft-input/soft-output decoder similar to the first decoder 11. Further, the second decoder 12 performs decoding using the received second element code E', and the extrinsic information LE1' interleaved by the interleaver 13 to output extrinsic information LE2' derived through the decoding.

The interleaver 13 interleaves data into a predetermined interleave pattern. For example, the interleaver 13 has a memory, and thus it is possible to interleave data by writing/reading the data into/from the memory. In writing data into the memory, the data may be rearranged in accordance with the interleave pattern, and in reading the data from the memory, the data may be read in the order from the top. Alternatively, in writing data into the memory, the data may be written in the order from the top, and in reading the data from the memory, the data may be read in accordance with the interleave pattern. Besides, the interleaver 13 interleaves the extrinsic information LE1 output from the first decoder 11 to output the extrinsic information LE1' to the second decoder 12.

The deinterleaver 14 deinterleaves the interleaved data into the original data arrangement. The deinterleaver 14 can deinterleave data by writing/reading the data to/from a memory like the interleaver 13. In writing data to the memory, the dada may be rearranged in accordance with a deinterleave pattern opposite to the interleave pattern, and in reading the data from the memory, the data may be read in the order from the top. Further, in writing data into the memory, the data may be written in the order from the top, and in reading the data from the memory, the data may be read in accordance with the deinterleave pattern. Also, the deinterleaver 14 deinterleaves the extrinsic information LE2' output from the second decoder 12 to send the extrinsic information LE2 to the first decoder 11.

The hard decision part 15 performs the hard decision on the soft-output data to generate a decoded sequence. In the hard decision, predetermined data such as "0" or "1" is selected based on data that takes on a given value such as the soft-output data. For example, if the soft-output data seems like "0" albeit only slightly, the data is determined as "0"; if the data seems like "1" albeit only slightly, the data is determined as "1".

Further, the hard decision part 15 performs the hard decision on the log likelihood ratio L supplied from the first decoder 11 to output the hard decision result as a decoded sequence D after the decoding is repeated. In this embodiment, since the log likelihood ratio L supplied from the first decoder 11, not the second decoder 12 is directly subjected to hard decision, it is unnecessary to rearrange the log likelihood ratio L through the deinterleaving.

Referring next to FIGS. 2A and 2B, the configuration of the decoding device according to this embodiment is described. FIG. 2A shows the configuration of the first decoder 11, and FIG. 2B shows the configuration of the second decoder 12.

As shown in FIG. 2A, the first decoder 11 includes a forward processing part 21, a backward processing part 22, memory 23, and an extrinsic information calculation part 24. The memory 23 stores information necessary for processing in the forward processing part 21, the backward processing part 22, and the extrinsic information calculation part 24.

The backward processing part 22 performs the backward processing using the first element code E and extrinsic information LE2 deinterleaved by the deinterleaver 14. The backward processing part 22 references the extrinsic information LE2 and the first element code E upward from the position (end point) behind the actual decoding position to calculate the β path metric from the end point in the Trellis diagram. Then, the backward processing part 22 stores the first element code E and extrinsic information LE2 which was used for the backward processing, and the β path metric calculated through the backward processing in the memory 23.

The forward processing part 21 performs the forward processing using the first element code E and extrinsic information LE2 stored in the memory 23 by the backward processing part 22. The forward processing part 21 references the extrinsic information LE2 and the first element code E downward from the position (start point) ahead of the actual decoding point to calculate the α path metric from the start point in the Trellis diagram. Then, the forward processing part 21 stores the α path metric calculated through the forward processing in the memory 23.

The extrinsic information calculation part 24 calculates the log likelihood ratio L using the α path metric and β path metric stored in the memory 23 by the backward processing part 22 and forward processing part 21 and derives the extrinsic information LE1. For example, the extrinsic information calculation part 24 calculates branch metric connecting the α path metric and β path metric to derive the log likelihood ratio L from the α path metric, the β path metric and the branch metric, and obtain the extrinsic information LE1 based on the log likelihood ratio L. Then, the extrinsic information calculation part 24 outputs the calculated log likelihood ratio L or extrinsic information LE1.

For example, the extrinsic information calculation part 24 obtains the log likelihood ratio L and the extrinsic information LE1 in the order in which the α path metric and the β path metric are calculated respectively, and outputs the log likelihood ratio L or extrinsic information LE1 in the stated order. In the first decoder 11, the forward processing part 21 performs the forward processing after the backward processing part 22 performs the backward processing. Hence, after the β path metric is calculated, the α path metric is calculated from the starting point downward in the Trellis diagram. Thus, the log likelihood ratio L and extrinsic information LE1 are calculated in this order (i.e., from the starting point downward) to output the log likelihood ratio L or extrinsic information LE1 in this order. Therefore, the log likelihood ratio L is output from the top of the data, making it possible to directly subject the data to hard decision without rearranging the data.

As shown in FIG. 2B, the second decoder 12 includes a forward processing part 21', a backward processing part 22', a memory 23', and an extrinsic information calculation part 24'. Respective components of the second decoder 12 are the same as those of the first decoder 11. Here, the second decoder 12 differs from the first decoder in terms of the data input/output relationship between the forward processing part 21 and the backward processing part 22, that is, the order of performing the forward processing and the backward processing.

The forward processing part 21' references the received second element code E' and extrinsic information LE1' from the starting point downward to calculate the α path metric to store the second element code E', the extrinsic information LE1', and the α path metric in the memory 23'. The backward processing part 22' references the extrinsic information LE1' and the second element code E' stored in the memory 23' by the forward processing part 21' from the end point upward to calculate the β path metric and store the calculated β path metric in the memory 23'. The extrinsic information calculation part 24'derives the extrinsic information LE2' similar to the extrinsic information calculation part 24.

In the second decoder 12, the forward processing part 21' performs the forward processing before the backward processing part 22' performs the backward processing. Hence, after the α path metric is calculated, the β path metric is calculated from the end point upward in the Trellis diagram. Therefore, the extrinsic information LE2' is derived in this order (i.e., from the end point upward) to output the extrinsic information LE2' in this order.

Referring next to FIG. 3, a decoding method according to this embodiment is described. This decoding method is implemented by the decoding device 1 of FIG. 1. That is, this decoding method repeatedly decodes the turbo-encoded first element code E and second element code E'.

According to this decoding method, first of all, the second element code E' is decoded (301). In this decoding, the backward processing (304) follows the forward processing (303). For example, if the second decoder 12 receives the second element code E' and the extrinsic information LE1', the forward processing part 21' performs the forward processing, after which the backward processing part 22' performs the backward processing. Then, the extrinsic information calculation part 24' obtains the log likelihood ratio L and the extrinsic information LE2' based on the path metrics calculated through the forward processing and the backward processing. The decoding order for the second element code E' is not limited thereto, and the forward processing may follow the backward processing.

Further, if the second element code E' is decoded for the first time, the extrinsic information LE1' has not yet been obtained, so an initial value is used. If it is decoded the second and subsequent times, the extrinsic information LE1' obtained by the first decoder 11 is used.

Subsequently, the first element code E is decoded (302). In this decoding, the forward processing (306) follows the backward processing (305). For example, when the first decoder 11 receives the first element code E and the extrinsic information LE2, the backward processing part 22 performs the backward processing before the forward processing part 21 performs the forward processing. Then, the extrinsic information calculation part 24 obtains the log likelihood ratio L and the extrinsic information LE1 based on the path metric calculated through the backward processing and the forward processing.

Next, decoding processings for the second element code E' and the first element code E are defined as one cycle, and this cycle is repeated N times (307). The code error correction ability is enhanced in proportion to the number of decoding cycles; the number of decoding cycles is, for example, 8 to 10.

The hard decision is performed after N decoding cycles (308). For example, the first decoder 11 counts the number of times the first element code E is decoded, and outputs, when the count value reaches N, the corresponding log likelihood ratio L to the hard decision part 15. The hard decision part 15 makes hard decision about the log likelihood ratio L supplied from the first decoder 11 to output the decoded sequence D.

In this way, according to this embodiment, after the decoding is repeated, the first decoder outputs the log likelihood ratio, so the log likelihood ratio can be directly subjected to hard decision without rearranging it. That is, unlike the log likelihood ratio output from the second decoder, there is no necessity for deinterleaving processing. Further, in the first decoder, the forward processing comes after the backward processing to output the log likelihood ratio, which eliminates the need to rearrange the log likelihood ratio in the reverse order. Thus, the deinterleaving or rearrangement processing can be skipped to reduce the decoding time, and besides save the power consumption. This is effective especially for an electronic device requiring low power consumption such as a cellular phone.

Figure 9:
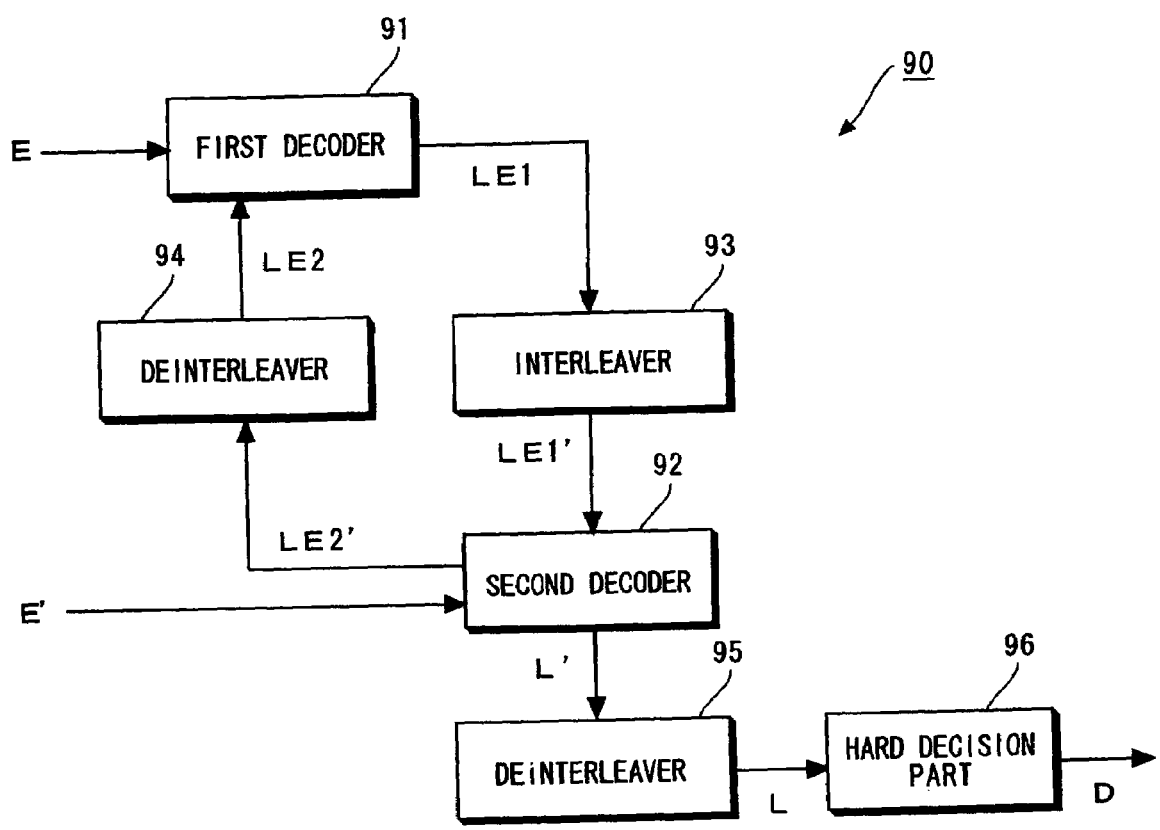
FIG. 9 is a block diagram showing the configuration of the conventional decoding device.
Figure 10:
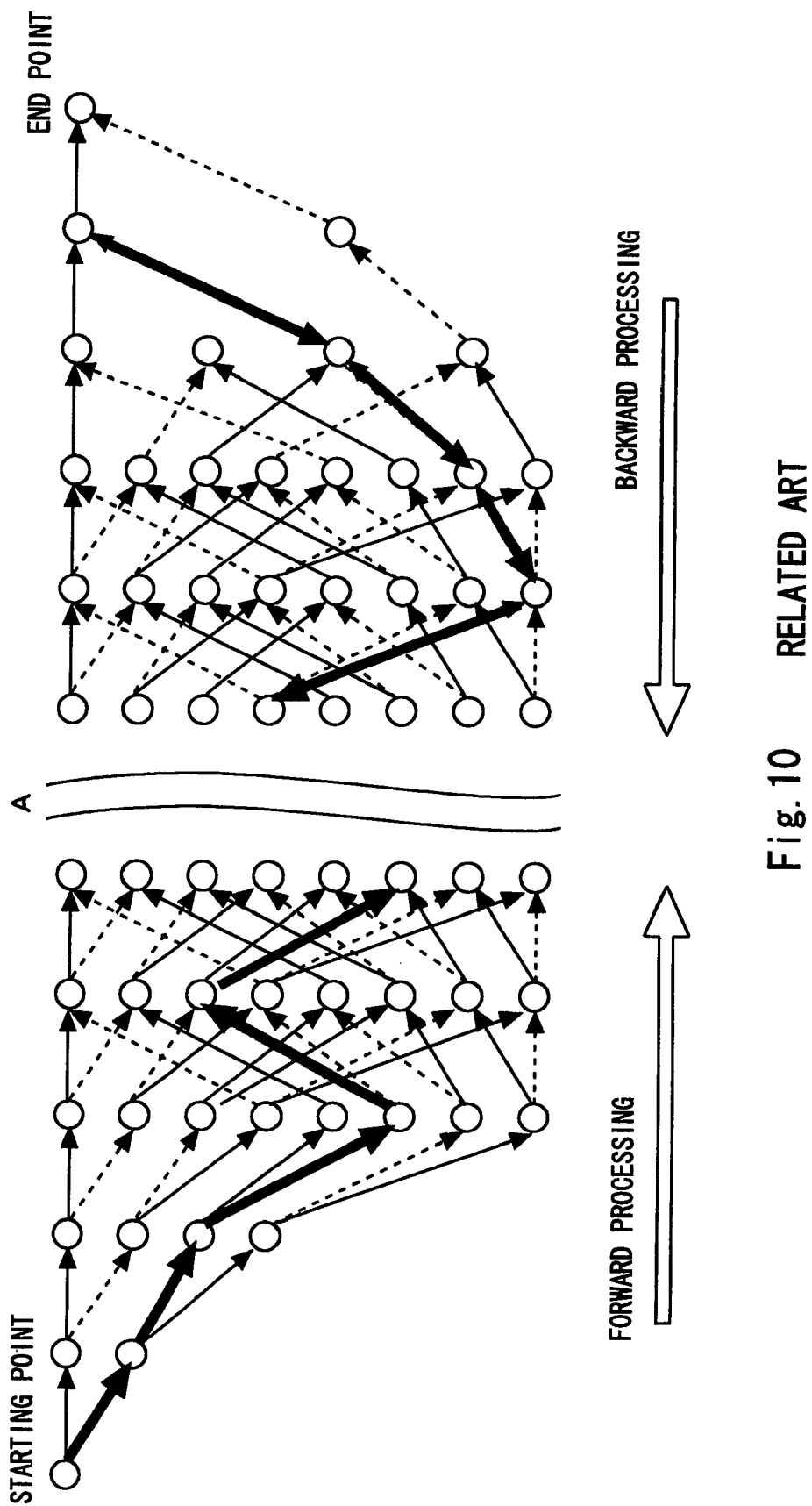
FIG. 10 shows an example of a Trellis diagram adopted in a typical decoder.

For example, the deinterleaving processing requires half the time necessary for one decoding cycle. However, this embodiment can dispense with this processing. In the case of 8 decoding cycles, the conventional example (FIG. 9) requires the processing time corresponding to 8.5 decoding cycles. However, this embodiment (FIG. 1) only requires the processing time corresponding to 8 decoding cycles, and thus can save the processing time corresponding to 0.5 decoding cycles (about 0.6%).

Second Embodiment of the Invention

Hereinbelow, FIGS. 4 to 7 are referenced to describe a decoding device and method according to a second embodiment of the present invention. The decoding device and method according to this embodiment have a feature that the decoded first element code E is subjected to hard decision and further to the CRC for the repeat control.

Figure 4:
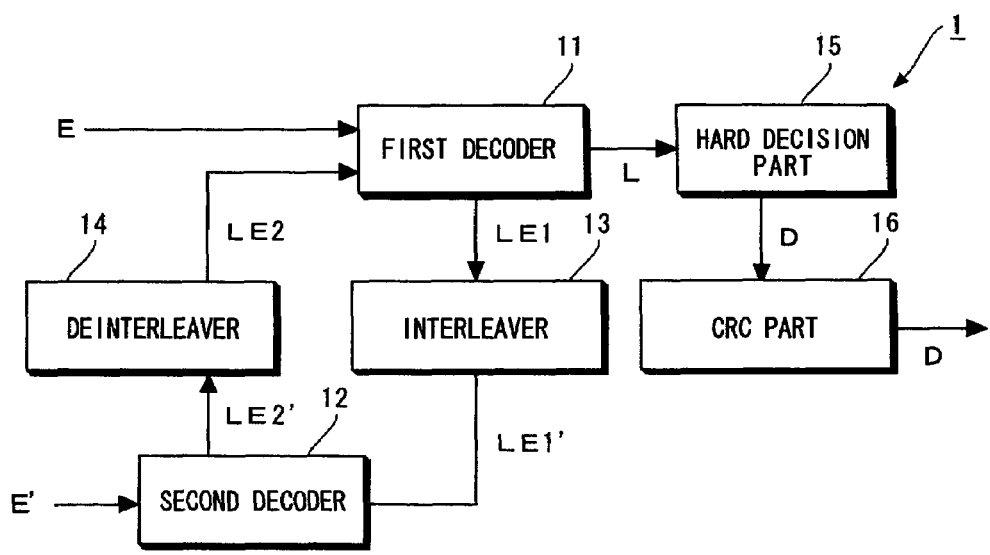
FIG. 4 is a block diagram showing the configuration of a decoding device according to the present invention.

Referring now to FIG. 4, the configuration of the decoding device according to this embodiment is described. In FIG. 4, the same components as those of FIG. 1 are denoted by like reference numerals, and their detailed description is omitted here.

As shown in FIG. 4, the decoding device 1 includes a CRC part 16 in addition to the components of FIG. 1. The CRC part 16 is an error detection part for performing the CRC decision on the decoded sequence D for error detection.

Figure 5:
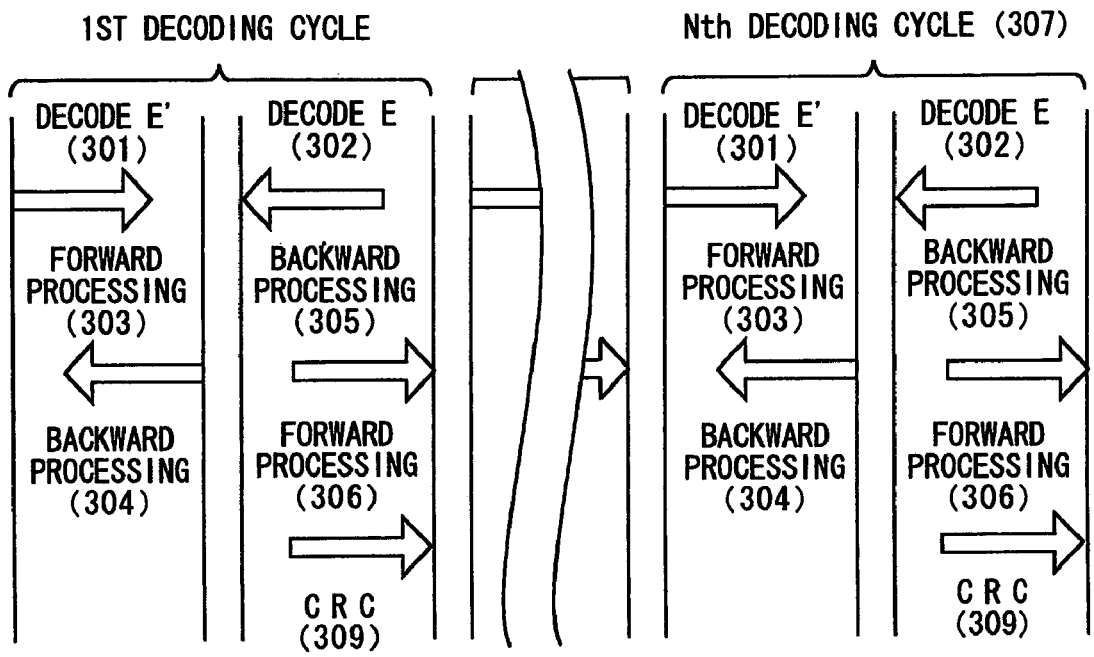
FIG. 5 illustrates a decoding method according to the present invention.

Referring next to FIG. 5, the decoding method according to this embodiment is described. This decoding method is implemented by the decoding device 1 of FIG. 4. Also, the decoding method includes the CRC in addition to the steps of the decoding method of FIG. 3. The decoding method of FIG. 5 is the same as that of FIG. 3 except the CRC, and thus is described in brief.

Similar to that of FIG. 3, this decoding method decodes the second element code E′ (301) and the first element code E (302), which is repeated N times (307). In this embodiment, each time the decoding is repeated, the CRC is carried out based on the result of decoding the first element codeE (309). For example, the first decoder 11 performs the backward processing (305) and the forward processing (306) every decoding process to output the extrinsic information LE1 to the interleaver 13 and output the log likelihood ratio L to the hard decision part 15. The hard decision part 15 performs the hard decision on the log likelihood ratio L to output the decoded sequence D to the CRC part 16. Then, the CRC part 16 performs the CRC calculation on the decoded sequence D for error detection.

If no error is found as a result of the CRC, the decoded sequence D is output without repeating the decoding. In contrast, if an error is found as a result of the CRC, the decoding is continuously repeated. For example, if the CRC calculation value coincides with the CRC value in the decoded sequence D, the CRC part 16 determines that there is no error to output the decoded sequence D. IF the CRC calculation value does not coincide with the CRC value, the CRC part informs the first decoder 11 that an error is found. In response thereto, the first decoder 11 and the second decoder 12 repeat decoding continuously as long as an error is detected.

After the decoding is repeated N times, similar to FIG. 3, the hard decision is made on the log likelihood ratio L supplied from the first decoder 11 to perform the CRC decision about the decoded sequence D and output the resulting decoded sequence D.

In this way, according to this embodiment, the log likelihood ratio L obtained by decoding the first element code E with the first decoder is subjected to hard decision and then CRC decision, whereby a repeat control accuracy is improved as compared with the conventional case of performing the hard decision and CRC check on the extrinsic information. That is, the CRC decision is made based on the log likelihood ratio L for actually obtaining the decoded sequence, so a reliability of error detection based on the CRC is enhanced, and the number of decoding cycles can be reduced with higher reliability. Accordingly, the decoding time can be shortened and the power consumption can be saved.

Further, the log likelihood ratio L output from the first decoder can be directly subjected to hard decision and CRC, whereby the deinterleaving processing can be omitted to shorten the decoding time more and more. In particular, the CRC for the repeat control is executed each time the decoding is repeated, so the effect of shortening the time is large in proportion to the number of decoding cycles.

Figure 6:
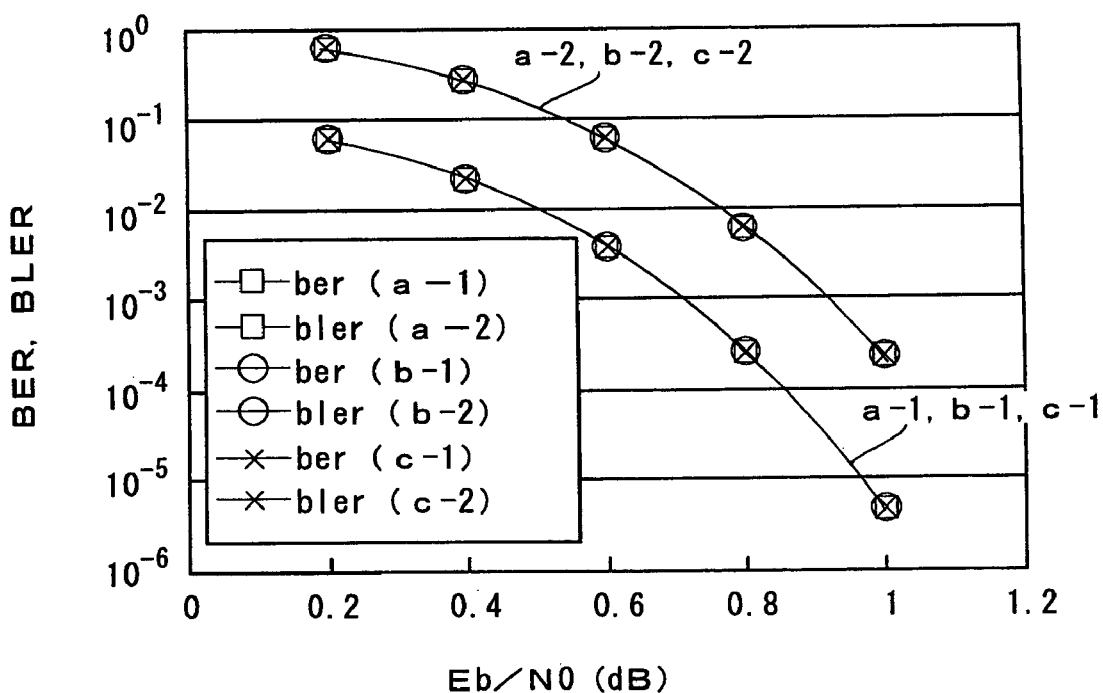
FIG. 6 is a graph showing a simulation result of the decoding device according to the present invention.
Figure 7:
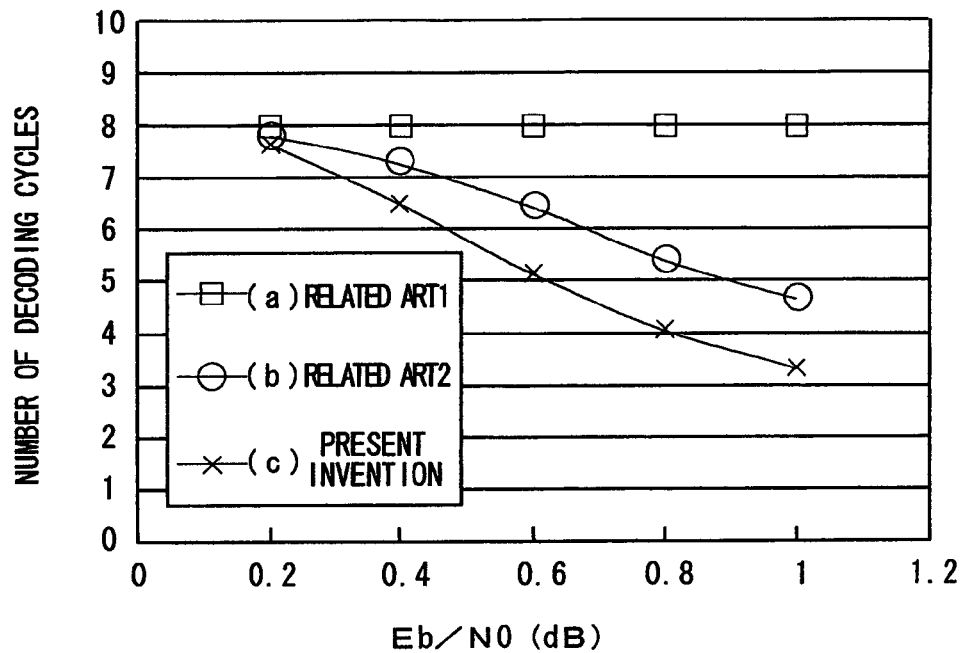
FIG. 7 is a graph showing a simulation result of the decoding device according to the present invention.

FIGS. 6 and 7 illustrate simulation results of the decoding device and method according to this embodiment.

FIG. 6 shows a code error rate of the decoding device. The horizontal axis of FIG. 6 represents Eb/N0. The Eb/N0 is a signal-to-noise ratio (SNR), in other words, a ratio of a signal energy Eb per bit to a band-based white noise power density N0. The small Eb/N0 indicates the larger noise component. The large Eb/N0 indicates the smaller noise component. The vertical axis of FIG. 6 represents a bit error rate (BER) indicative of a bit-based error rate and a block error rate (BLER) indicative of an error rate on the basis of block including plural bits.

Figure 11:
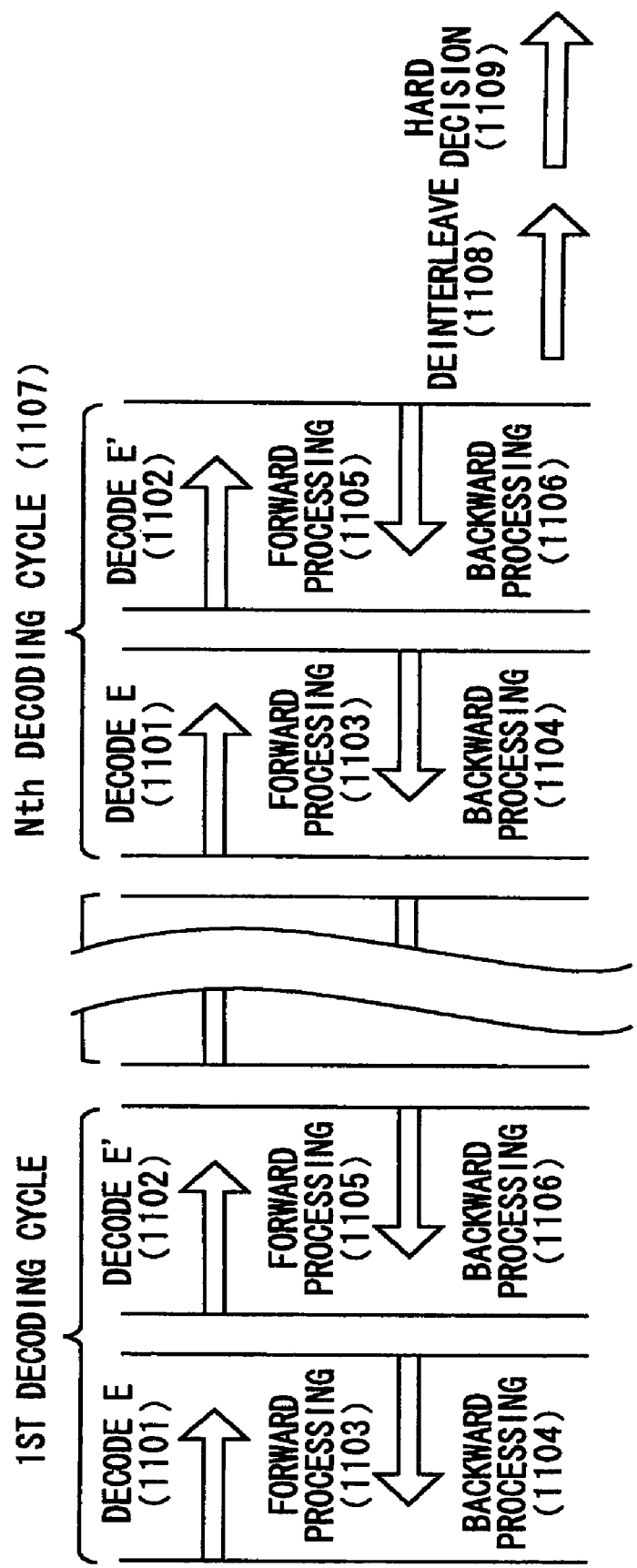
FIG. 11 illustrates a conventional decoding method.
Figure 12:
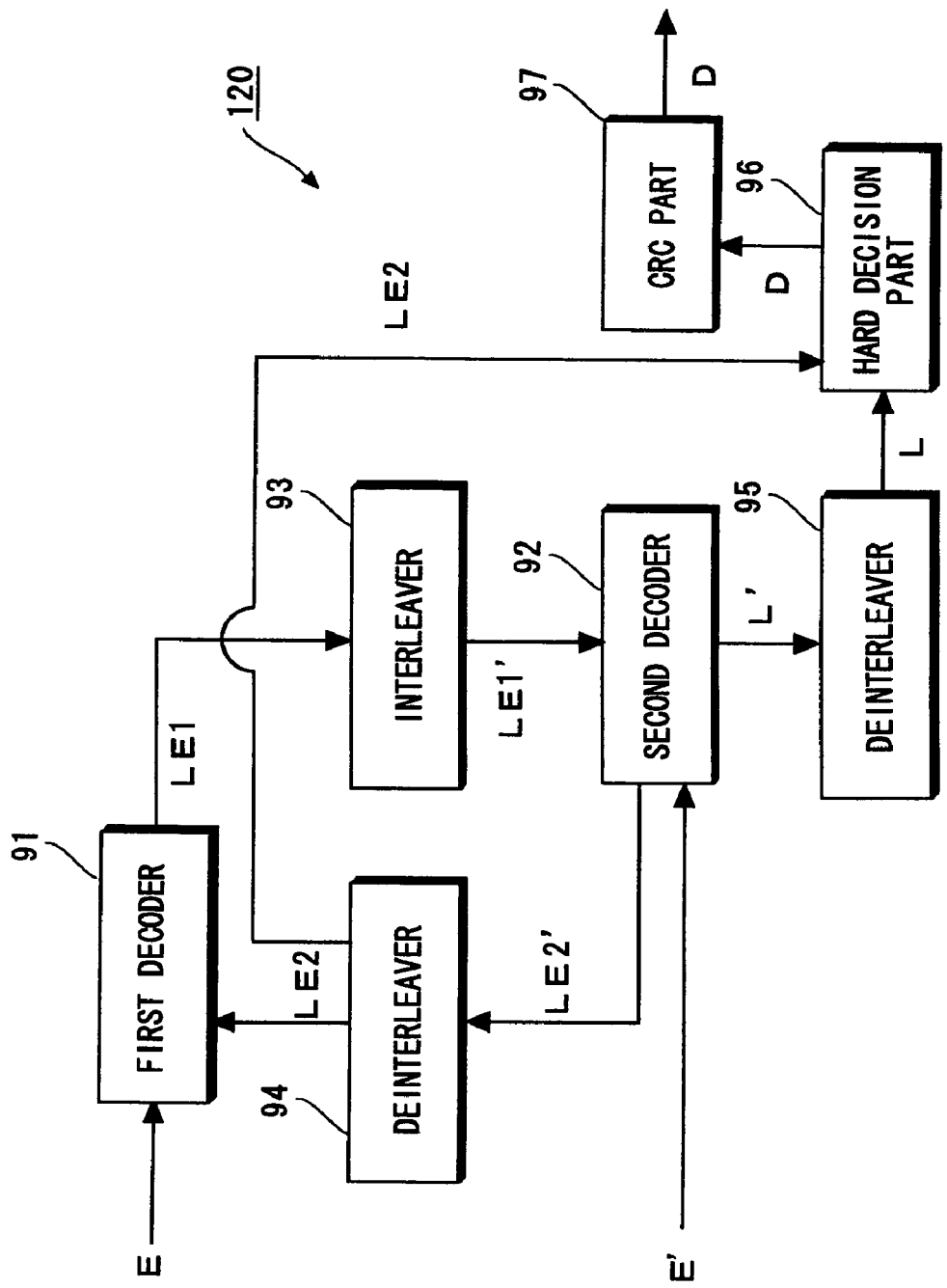
FIG. 12 is a block diagram showing the configuration of the conventional decoding device.
Figure 13:
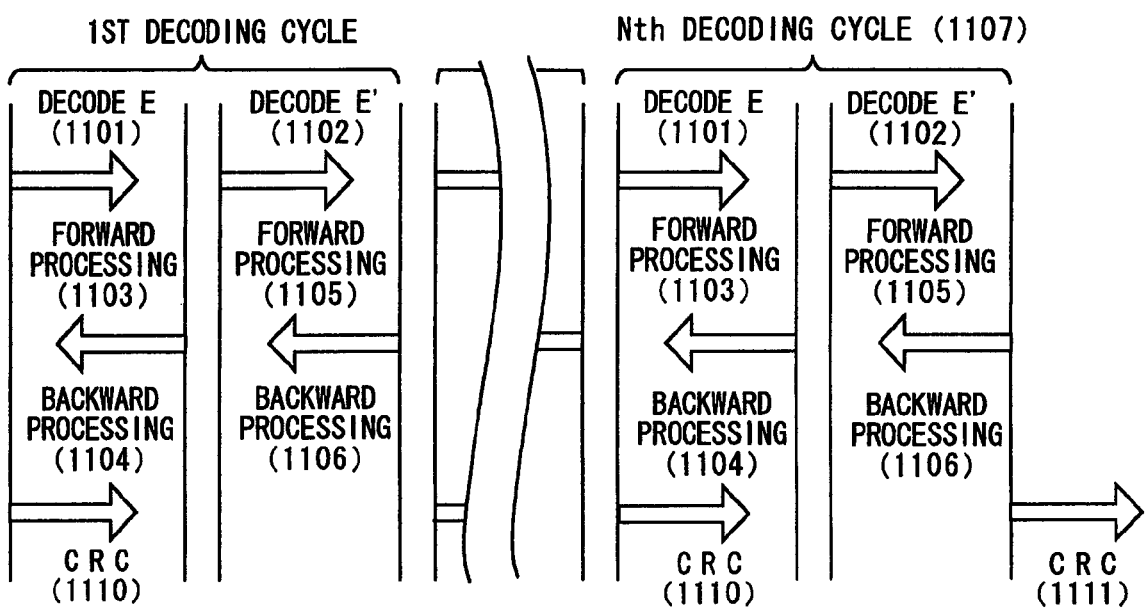
FIG. 13 illustrates a conventional decoding method.

In FIG. 6, (a-1) represents a BER characteristic of Prior Art example 1 (FIGS. 9 and 11), that is, BER characteristic in the case of performing a fixed number of decoding cycles, (b-1) represents a BER characteristic of Prior Art example 2 (FIGS. 12 and 13), and (c-1) represents a BER characteristic of this embodiment (FIGS. 4 and 5). Further, (a-2) represents a BLER characteristic of Prior Art example 1, (b-2) represents a BLER characteristic of Prior Art example 2, and (c-2) represents a BLER characteristic of this embodiment.

As shown in FIG. 7, Prior Art example 1, Prior Art example 2, and this embodiment show almost the same BER and BLER characteristics. This is because the error rate characteristic is improved in proportion to the number of decoding cycles, and thus, after the decoding is repeated a given number of times, similar characteristics are attained in every case.

FIG. 7 shows the number of decoding cycles in the code error characteristic of FIG. 6, in other words, the number of decoding cycles at each Eb/N0. In FIG. 7, (a) represents the number of decoding cycles of Prior Art example 1, (b) represents the number of decoding cycles of Prior Art example 2, and (c) represents the number of decoding cycles of this embodiment.

In FIG. 6, the respective cases show similar characteristics, but as shown in FIG. 7, differ from one another in the number of decoding cycles. As shown in FIG. 7, in Prior Art example 1, the number of decoding cycles is fixed to 8 at every Eb/N0. In Prior Art example 2, the number of decoding cycles is smaller than that of Prior Art example 1; the number of decoding cycles is reduced from about 8 to about 4.5 in inverse proportion to the Eb/N0. The number of decoding cycles of this embodiment is the smallest of all the cases, and reduces from about 7.5 to about 3.5 in inverse proportion to the Eb/N0. For example, taking BLER=$10^{-2}$ as a reference, it is understood from FIG. 6 that the Eb/N0 is 0.8 at this time. As apparent from FIG. 7, the number of decoding cycles at the Eb/N0 of 0.8 dB is about 4 in this embodiment in comparison with about 5.5 in Prior Art example 2. That is, it is revealed that the decoding time corresponding to 1.5 decoding cycle on average (about 27%) can be reduced.

Other Embodiment of the Invention

The above embodiments describe the example in which the second element code E' and the first element code E are repeatedly decoded, but the present invention is not limited thereto, and may adopt any configuration where the log likelihood ratio output from the first decoder is subjected to hard decision.

Further, the above embodiments describe the example in which the data is repeatedly decoded using two decoders, but the present invention is not limited thereto, and the decoding may be repeated using a given number of decoders.

It is apparent that the present invention is not limited to the above embodiment and it may be modified and changed without departing from the scope and spirit of the invention.

What is claimed is:

1. A decoding method comprising:

obtaining first and second element codes through a transmission channel;

performing a first decoding by calculating a and 13 path metrics in this order using the first element code and a first extrinsic information to store the a and 13 path metrics in a first memory;

obtaining a second extrinsic information using the a and 13 path metrics stored in the first memory;

performing a second decoding following the first decoding by calculating a $\beta$ and $\alpha$ path metrics in this order using the second element code and the second extrinsic information to store the $\beta$ and $\alpha$ path metrics in a second memory;

obtaining the first extrinsic information using the 13 and a path metrics stored in the second memory;

outputting a decoded sequence corresponding to the first and second element code based on a result of the second decoding;

deinterleaving the second extrinsic information and outputting deinterleaved second extrinsic information after obtaining the second extrinsic information; and interleaving the first extrinsic information and outputting interleaved first extrinsic information after obtaining the first extrinsic information.

2. The method according to claim 1, further comprises:

performing a hard decision based on a soft-output data generated by the second decoding.

3. The method according to claim 2, wherein the second element code is obtained by encoding an information sequence; and the first element code is obtained by interleaving said information sequence to be encoded.

4. The method according to claim 1, further comprising:

performing the first decoding is using the first element code which is obtained by interleaving an information sequence to be encoded and the interleaved first extrinsic information, and the performing the second decoding is using the second element code which is obtained by encoding the information sequence and the deinterleaved second extrinsic information.

* * * * *